United States Patent [19]
Jewell et al.

[11] Patent Number: 5,325,386
[45] Date of Patent: Jun. 28, 1994

[54] VERTICAL-CAVITY SURFACE EMITTING LASER ASSAY DISPLAY SYSTEM

[75] Inventors: Jack L. Jewell; Gregory R. Olbright, both of Boulder, Colo.

[73] Assignee: Bandgap Technology Corporation, Broomfield, Colo.

[21] Appl. No.: 871,461

[22] Filed: Apr. 21, 1992

[51] Int. Cl.$^5$ .............................................. H01S 3/19
[52] U.S. Cl. .................................. 372/50; 372/45; 359/214; 359/215
[58] Field of Search .............. 372/45, 503; 359/214, 359/215, 212

[56] References Cited

U.S. PATENT DOCUMENTS

| | | | |
|---|---|---|---|
| 4,902,083 | 2/1990 | Wells | 359/214 |
| 4,934,773 | 6/1990 | Becker | 359/214 |
| 4,949,350 | 8/1990 | Jewell et al. | 372/45 |
| 5,003,300 | 3/1991 | Wells | 340/705 |
| 5,009,473 | 4/1991 | Hunter et al. | 359/214 |
| 5,023,905 | 6/1991 | Wells et al. | 379/96 |
| 5,031,187 | 7/1991 | Orenstein et al. | 372/50 |
| 5,034,344 | 7/1991 | Jewell et al. | 437/129 |
| 5,048,077 | 9/1991 | Wells et al. | 379/96 |

OTHER PUBLICATIONS

Jose et al., "An Avionic Gray-Scale Color Head Down Display," *SPIE vol. 1289 Cockpit Displays and Visual Simulation*, 1990, pp. 74–80.
Burley et al., "A Full-Color Wide-Field-of-View Holographic Helmet-Mounted Display for Pilot/Vehicle Interface Development and Human Factors Studies," *SPIE vol. 1290 Helmet-Mounted Displays II*, 1990, pp. 9–15.
G. O. Mueller, "Flat-Panel Displays for High-Definition Television," *Displays*, Jan., 1991, pp. 31–40.
A. Woodhead, "Recent Developments in Displays," *Displays*, Jan. 1991, pp. 50–51.
Orenstein et al., "Matrix-Addressable Vertical Cavity Surface Emitting Laser Array," *Electronic Letters*, vol. 27, 1991, pp. 437–438.

*Primary Examiner*—Georgia Y. Epps
*Attorney, Agent, or Firm*—Pennie & Edmonds

[57] ABSTRACT

A visual display system is disclosed which utilizes one- and/or two-dimensional arrays of visible emitting vertical-cavity surface-emitting lasers (VCSELs) in order to provide a desired visual display within an observer's field of view. Sweep and subscanning techniques are employed, individually or in combination, to create a full M×N image from 1×L or K×L arrays of VCSELs, where M and N are multiple integers of K and L, respectively. Preferably, the VCSELs are contained within a display housing which may be attached to the head of the user by an attachment mechanism or may alternatively be hand held or mounted to a surface. The circular symmetry and low divergence of the emitted VCSEL radiation as well as the availability of multiple wavelengths, particularly, red, blue and green, allow high resolution monochrome or color images to be generated.

59 Claims, 8 Drawing Sheets

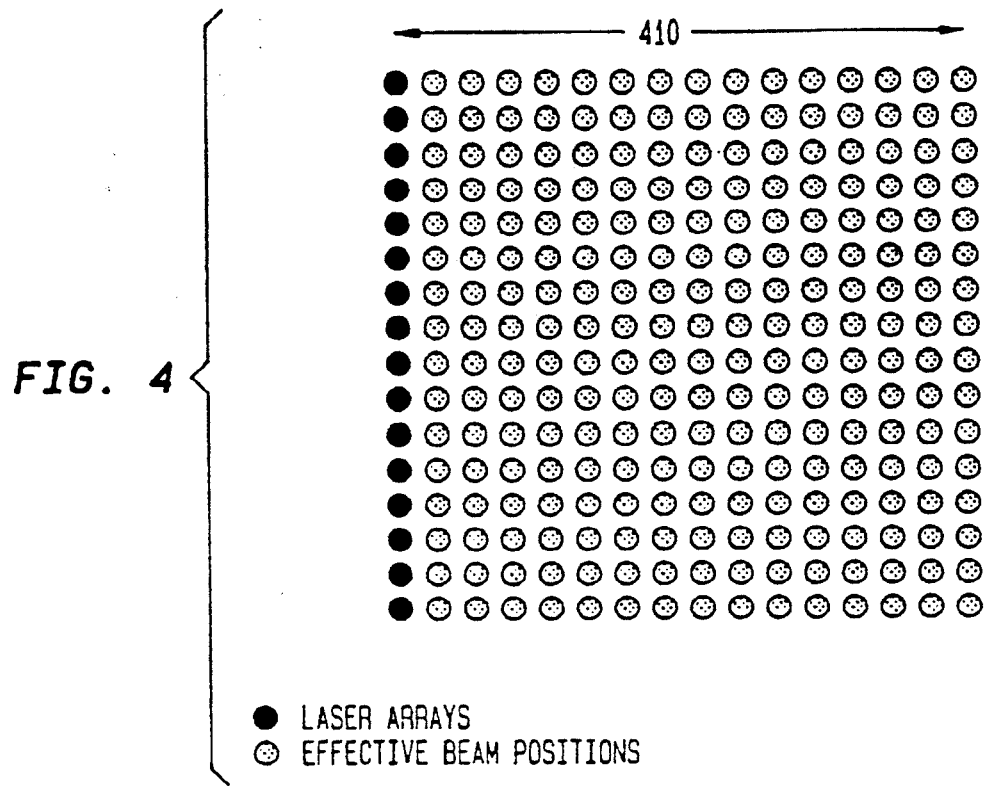
FIG. 4
- LASER ARRAYS
- ⊙ EFFECTIVE BEAM POSITIONS
FIG. 5
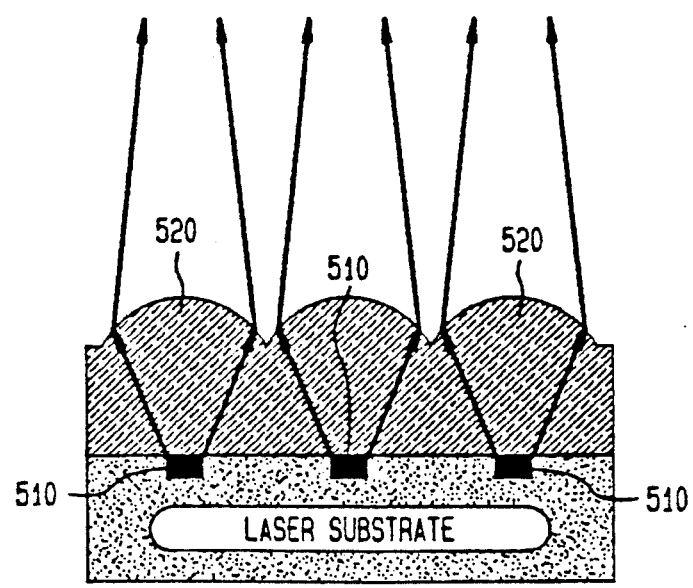

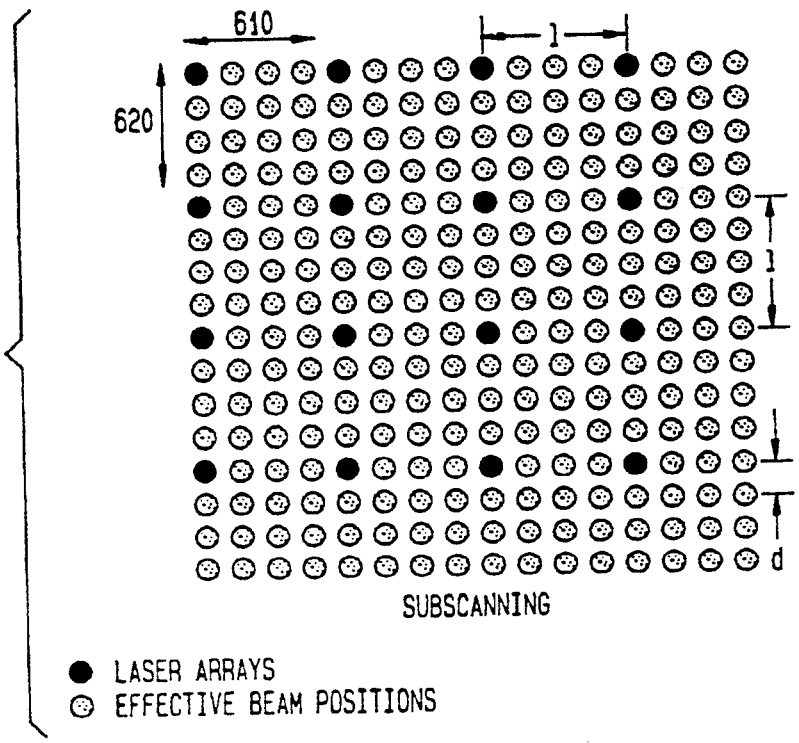
FIG. 6
- LASER ARRAYS
- ⊙ EFFECTIVE BEAM POSITIONS
FIG. 7
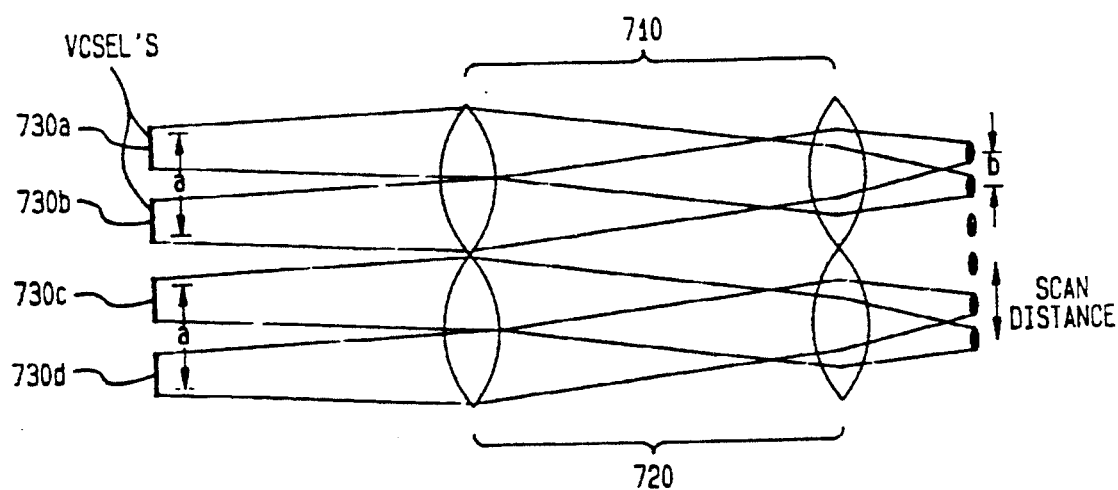

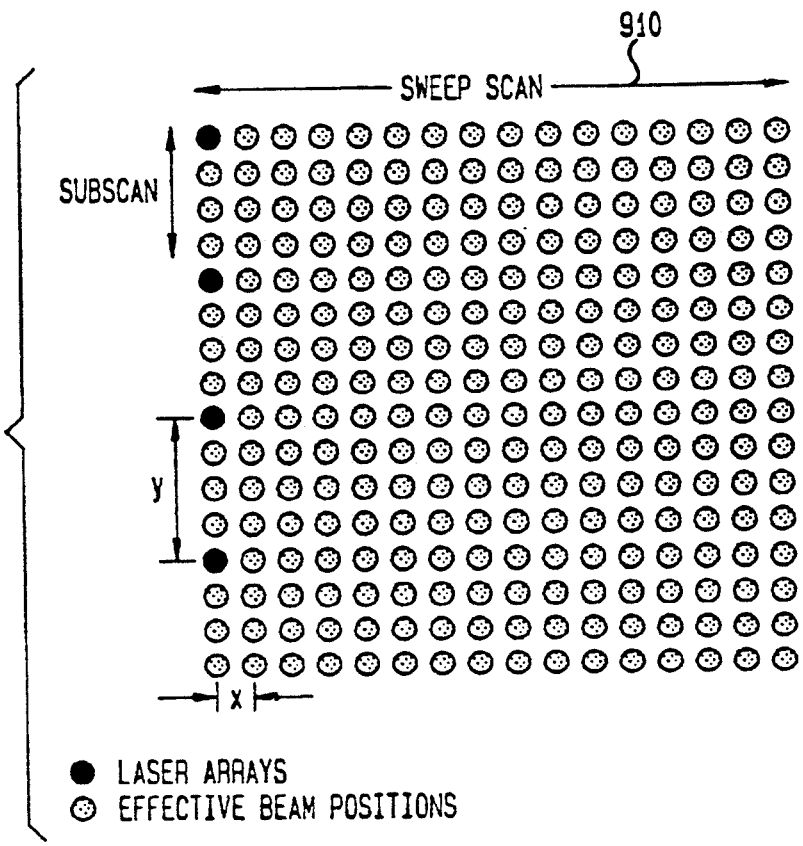
FIG. 10
● LASER ARRAYS
⊙ EFFECTIVE BEAM POSITIONS
FIG. 11
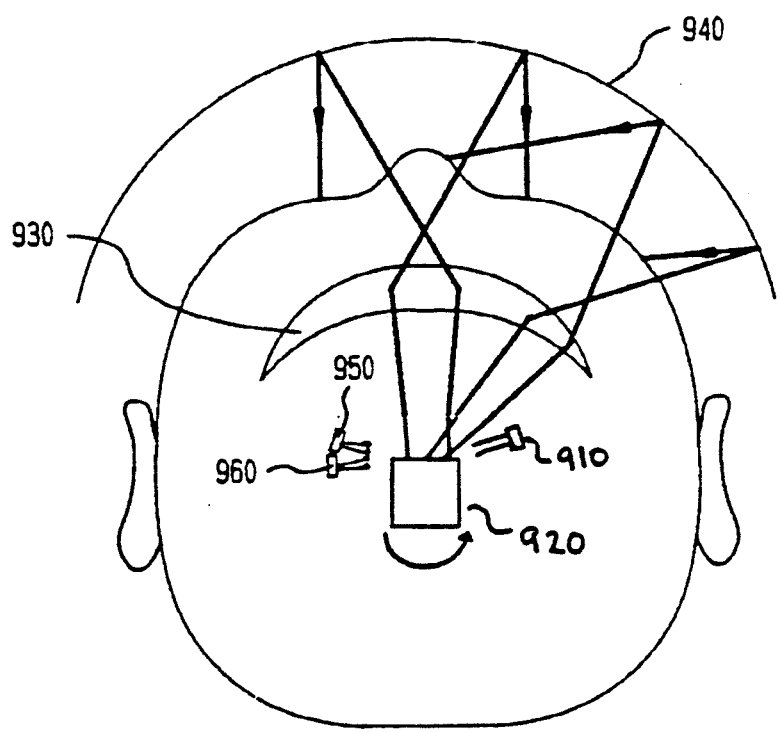

VERTICAL-CAVITY SURFACE EMITTING LASER ASSAY DISPLAY SYSTEM

CROSS-REFERENCE TO RELATED APPLICATION

This application is related to our copending application Ser. No. 07/790,964 U.S. Pat. No. 5,285,990 entitled "Visible Light Surface Emitting Semiconductor Laser" filed on Nov. 7, 1991, which is incorporated herein by reference.

FIELD OF THE INVENTION

The present invention relates to the field of miniature visual displays and, more particularly, to miniature visual displays that utilize visible emitting vertical-cavity surface-emitting lasers (VCSELs) to project a display within an observer's field of view.

BACKGROUND OF THE INVENTION

Because of the human visual sensory system's enormous capacity to absorb and process information, visual displays are extremely effective in displaying a variety of information formats, such as, for example, moving sceneries, alphanumeric characters, maps, graphs, and targeting data, all of which may be superimposed on an observer's normal field of vision. Particularly, tactical military operations requiring highly complex series of tasks to be performed in unpredictable environments greatly benefit from the use of miniature visual displays, such as head-up, direct view, or helmet-mounted displays. For instance, tactical aircraft personnel are now being equipped with helmet-mounted displays (HMDs) which allow a miniature visual display system to be held on the head of the observer so as to project a display within the observer's field of vision. In the commercial sector, high-resolution HMDs can provide a "virtual reality" for entertainment and education.

In the last decade, a vast amount of effort has been expended to develop compact, lightweight visual displays, such as HMDs. Desirably, miniature visual displays should efficiently deliver an image generated from the display device, typically a cathode ray tube (CRT), to the observer's field of view with minimal or no distortion. Unfortunately, the progress made to date in the miniature visual display and, more particularly, the HMD technology has been primarily in the classical or holographic optics used in the imaging or relaying of the image. See, for example, J. R. Burley et al., "A Full-Color Wide-Field-of-View Holographic Helmet Mounted Display for Pilot/Vehicle Interface Development and Human Factors Studies," *Proceedings of the SPIE*, Vol. 1290, pp. 9–15 (1990).

Very little progress has, in fact, been made in developing compact, high brightness, high contrast, low power CRTs. Accordingly, the lack of suitable compact CRTs severely limited the applicability of miniature visual displays, leading to the development of miniature display systems which utilized other suitable display devices.

One such display system is disclosed in U.S. Pat. No. 5,003,330, which is incorporated herein by reference. This display system utilizes a diode array fixed within a helmet-visor structure. Although these diode arrays perform acceptably in the helmet, they have not been completely satisfactory for displaying high resolution and/or color display images. Linear diode arrays and even diode laser arrays required to achieve such improvements are either not available at the desired visible wavelengths for color display images or not available in the array sizes required for color or high resolution miniature visual display applications.

Further, prior art lasers are not suitable for two-dimensional array fabrication or micro-optic integration which is preferred for today's scanning, printing and display applications. This is due to the astigmatic beam quality of conventional semiconductor lasers as well their high divergence which make it prohibitively difficult to project high resolution images within the field of view of the observer without the use of relatively expensive and bulky optics.

Other display devices which have also been developed in an effort to replace the dominant image display device, include, for example, liquid crystal displays (LCDs), AC and DC plasma displays, thin film electroluminescence displays, and vacuum fluorescent displays. Each of these alternative technologies, however, has fundamental shortcomings, particularly for addressing HMD applications. LCDs, for example, have a very low efficiency in generating, modulating, and transmitting light. See, for example, D. L. Jose et al., "An Avionic Grey-Scale Color Head Down Display," *Proceedings of the SPIE*, Vol 1289, pp 74–98 (1990). Plasma displays, on the other hand, require on the order of approximately 100 volts or more, while the other alternative display devices are difficult to scale down to sizes achievable with either the diode or laser array (approximately 20–40 $\mu m^2$ per element) technology necessary to achieve miniaturization.

To date, therefore, the size, nature and/or availability of wavelengths for display devices have limited the practicality and utility of miniature visual displays.

It is therefore an object of the present invention to provide a visual display system that utilizes compact, solid state, high efficient, high brightness, and high contrast display devices for providing monochrome as well as full color displays to an observer's field of view.

It is a further object of the present invention to provide a miniature visual display system that provides a high resolution color image of visual information and is suitable for a broad range of consumer, industrial, business, medical and military applications.

It is still a further object of the present invention to provide a miniature visual display system or technology that is compatible with the existing classical and holographic optics and which utilizes a display device that is superior to the prior art display devices to achieve a higher resolution.

SUMMARY OF THE INVENTION

These and other objects are achieved in accordance with the invention in a miniature visual display system that utilizes visible laser diode arrays (VLDAs) and, more preferably, that utilizes one- and/or two-dimensional arrays of visible emitting vertical-cavity surface-emitting lasers (VCSELs) in order to provide a desired visual display within an observer's field of view.

In preferred embodiments, sweep and sub-scanning techniques, individually or in combination, are employed to create a full M×M image from 1×N or N×N arrays of VCSELs, where M is a multiple integer of N. Such scanning techniques advantageously further increase the resolution of the displayed image for a given number of VCSELs by displacing the image of the VCSELs within the field of view of the observer as the VCSELs are simultaneously modulated with the information to be displayed.

Preferably, the VCSELs are contained within a display housing which may be attached to the head of the user by an attachment mechanism or alternatively may be hand held or mounted. Advantageously, the circular symmetry and low divergence of the emitted VCSEL radiation as well as the availability of multiple wavelengths, particularly, red, blue and green, allow high resolution monochrome or color images to be generated. Addressing individual VCSELs within two-dimensional arrays is achieved by utilizing matrix addressing techniques, such as by the use of a row/column addressing geometry.

BRIEF DESCRIPTION OF THE DRAWING

A more complete understanding of the invention may be obtained by reading the following description in conjunction with the appended drawings in which:

FIG. 4 is an illustration of the effective beam positions seen by an observer viewing into the VCSEL array display system of FIG. 3;

FIG. 5 is a cross-sectional view of a monolithically integrated VCSEL array and micro-lenslets used in the practice of the present VCSEL array display system;

FIG. 6 is an illustration of the effective beam positions seen by an observer viewing into a VCSEL array display system utilizing sub-scanning which improves the image resolution;

FIG. 7 is an illustration of the use multiple microlenslets with sub-scanning to increase the effective resolution of the display system of the present invention;

FIG. 10 is an illustration of the effective beam positions seen by an observer viewing into a VCSEL array display system utilizing sweep scanning in conjunction with sub-scanning;

FIG. 11 is a top view of a ultra-wide field-of-view helmet mounted display in accordance with the invention.

DETAILED DESCRIPTION

The present invention is based on utilizing visible emitting vertical-cavity surface emitting lasers (VCSELs) to develop a high brightness, high efficient, compact display technology and, more specifically, a VCSEL array display system. Particularly, the size, structure and nearly-ideal beam qualities of the VCSELs afford high resolution monochrome or color display images, real or virtual, to be placed within an observer's field of view.

Figure 1:
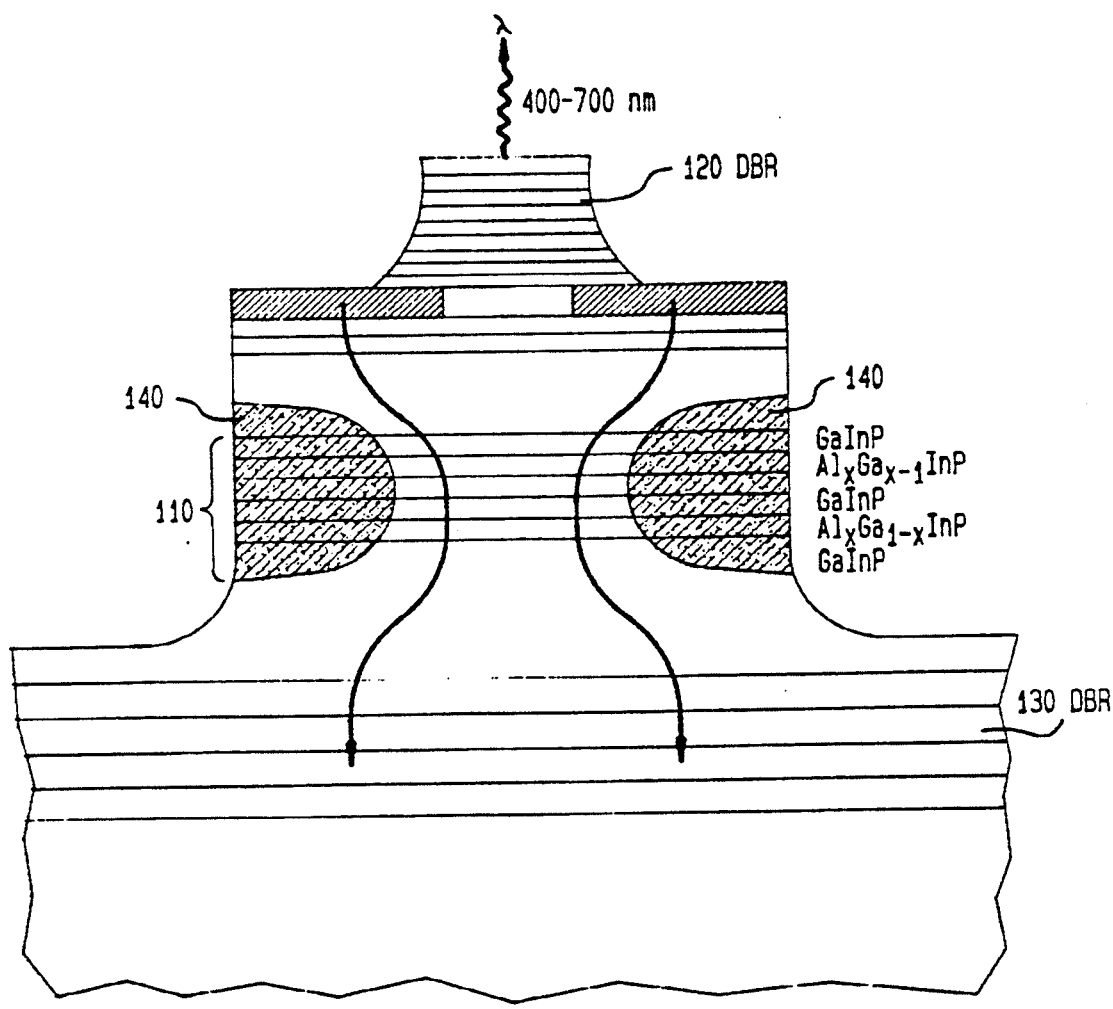
FIG. 1 is a cross-sectional view of a visible emitting vertical-cavity surface-emitting laser (VCSEL)

VCSELs are a new class of semiconductor lasers which unlike conventional edge-emitting laser diodes emit laser radiation in a direction perpendicular to the plane of the p-n junction formed therein. As disclosed in our co-pending application Ser. No. 07/790,964 U.S. Pat. No. 5,258,990 VCSELs may now be fabricated to emit visible laser radiation in the range between 0.4 and 0.7 $\mu$m by utilizing an active quantum well region 110 comprising alternating layers of, for example, GaInP and $Al_xGa_{1-x}InP$ which are sandwiched between two distributed Bragg reflectors (DBRs) or mirrors 120 and 130, as illustrated in FIG. 1.

In operation, injection current is typically confined within active region 110 by the use of annular shaped proton implanted regions 140 to achieve stimulated emission. Importantly, VCSELs may be fabricated in one- and/or two-dimensional arrays and may be integrated with micro-optics. With the appropriate selection of materials, each VCSEL can be made to emit laser radiation in different portions of the visible region of the electromagnetic spectrum. The operation and fabrication of these VCSELs are discussed in detail in the above-identified related application and will not be described in detail here for the sake of brevity.

Figure 2:
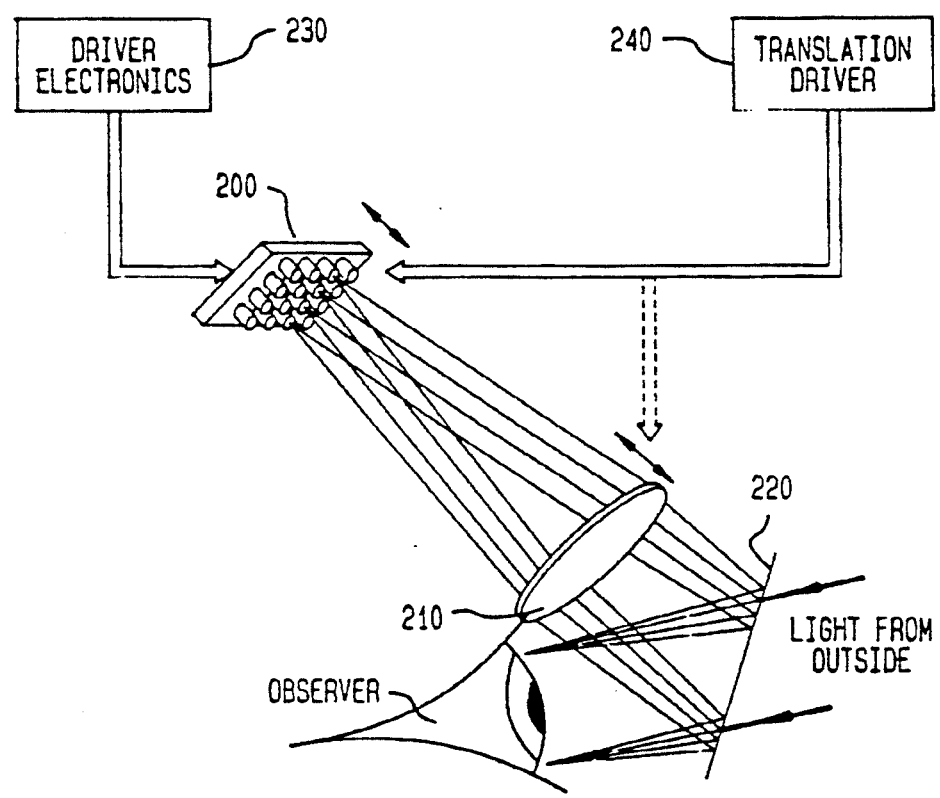
FIG. 2 is an exemplary VCSEL array display system in accordance with the principles of the invention.

The basic concept of the VCSEL array display system is illustrated in FIG. 2. It is to be understood, however, that the VCSEL array display system depicted in FIG. 2 is for the purpose of illustration only and not for the purpose of limitation. The VCSEL array display system, which is typically positioned about the observer's head, such as for use as a HMD, comprises an array of VCSELs 200, a lens system 210, and, preferably, a partially transmitting faceplate 220, such as a dichroic filter or mirror. Lens system 210 is placed approximately an effective focal length away from VCSEL array 200 so as to collimate the visible radiation emitted from VCSEL array 200 in order to produce a virtual image of VCSEL array 200 in accordance with well-known optical theory. At any instant in time, an observer looking into faceplate 220 sees simultaneously a virtual image of VCSEL array 200 as well as external visual information that is directed toward faceplate 220.

In displaying the desired image to the observer, each laser within VCSEL array 200 may be individually addressed and modulated with the appropriate chroma or monochrome information by driver electronics 230. The necessary electrical signals to address and generate the desired light intensity have very low drive currents and voltages that are compatible with analog or digital integrated CMOS and TTL electronic circuits.

Additionally, three-dimensional virtual images can be produced by translating VCSEL array 200 or, alternatively, lens system 210 along the optical axis of the system to sweep the virtual image location from infinity to a distance close to the observer. Such translation may be readily accomplished by a translation driver 240 that utilizes mechanical servos or piezoelectric transducers to physically move the array or lens.

It is anticipated that the space occupied by VCSEL array 200 will be approximately the same as that occupied by the phosphor screens of prior art miniature CRTs, which typically have a dimension of approximately 20×20 mm. Accordingly, critical parameters such as the HMD's field of view (FOV) and packaging known in the prior art will remain substantially unaffected by utilizing VCSEL array 200 rather than the conventional CRT or other well known display devices. Moreover, those skilled in the art will know of optical designs and packing means which would further facilitate the use of VCSEL array 200 as a display system suitable for attachment to the head of an observer or for hand-held use. For example, see U.S. Pat. Nos.

5,023,905 and 5,048,077 which are incorporated herein by reference. For instance, the VCSEL array display of the present invention may be packaged in a display unit having an opening through which the image may be viewed and may be attached to a sidewall of a user's helmet, or a user's eyeglasses. Alternatively, the display system may be attached to a user's belt, with remote display information provided from a computer, pocket calculator, or radio wave transmitter.

In one embodiment, VCSEL array 200 comprises a two-dimensional M×M array of individually addressable VCSELs. VCSELs within the M×M array may be fabricated to lase either at one predetermined wavelength or at several wavelengths, such as blue, green and red, to produce monochrome or full color images, respectively, in accordance with well known colorimetry theory.

The VCSEL array is fabricated using conventional planar large scale integration (LSI) processing techniques, such as molecular beam epitaxy (MBE), wet chemical etching and the like. More particularly, the two-dimensional array is fabricated by first depositing epitaxially the semiconductor layers of the VCSEL structure and then defining, for example, by optical photolithography and etching a plurality of columns, each a separably addressable VCSEL. Contacts to the VCSELs are formed by conventional deposition techniques wherein, for example, common row and column bus contacts may be formed to individually address each VCSEL, as disclosed in our co-pending application Ser. No. 07/823,496 entitled "Integration of Transistors With Vertical Cavity Surface Emitting Lasers" filed on Jan. 21, 1992, which is incorporated herein by reference.

The number of VCSELs in the two-dimensional array will, of course, be dependent on the required resolution as well as the width and length of the displayed image projected to the observer.

In comparison to edge-emitting lasers, which are a few hundred microns long by 10 $\mu$m, each VCSEL is approximately 10 $\mu$m in diameter, affording more than twenty-five times more display elements per unit area than prior art display devices. Importantly, the emitted radiation has a circular symmetry as well as a low divergence which allow low numerical aperture lens system to be employed in generating an enlarged virtual image of the VCSELs. Also, since the VCSELs have no inherent astigmatism and can be fabricated as closely-spaced, individually electrically addressable display elements, it will be apparent to those skilled in the art that an enhanced resolution may be achieved.

Information is applied to the VCSELs by individually addressing each VCSEL through the use of, for example, a matrix or row/column addressing contacts similar to those used for charged coupled device (CCD) arrays. Fully addressing a M×M array of display devices electronically requires $M^2$ leads, which is prohibitively impractical at array sizes much larger than 16×16 (256 leads). Accordingly, information is applied to the VCSELs by individually addressing each of the VCSELs through the use of the matrix or row/column addressing geometry, reducing the number of leads from $M^2$ to 2 M. See, for example, M. Orenstein et al., "Matrix-Addressable Vertical Cavity Surface Emitting Laser Array," *Electronic Letters*, Vol. 27, pp. 437–438 (1991), which is incorporated herein by reference. Associated driver electronics 230, including, for example, shift registers, transistors, and the like, used for addressing and modulating the intensity of the emitted radiation may be integrated on the chip or substrate containing the VCSEL array rather than being located external to the display unit. Such integration further reduces the number of leads, allowing large arrays, e.g., 512×512, to be readily fabricated.

If the number of elements in the VCSEL array matches the required resolution of the displayed image, no scanning other than the electronic addressing is necessary. However, to increase the resolution for given number of VCSELs or to reduce the number of VCSELs needed to achieve a desired resolution, various scanning techniques may be employed. More particularly, those skilled in the art will appreciate that scanning allows a full page display to be created from a much smaller number of display devices than is necessary to generate the full page display, whether for a real or virtual image.

For example, a M×M display image may be generated from a 1×M VCSEL array by utilizing a technique known as full-sweep scanning. The full page display is achieved by scanning along one axis the VCSEL's virtual-image position perceived by the observer. In this type of scanning, the VCSEL array comprises a plurality of linearly-aligned VCSELs having an individual VCSEL or element for each resolution element along one axis. Resolution elements along the other axis are provided by the scanning mechanism discussed in more detail below.

Figure 3:
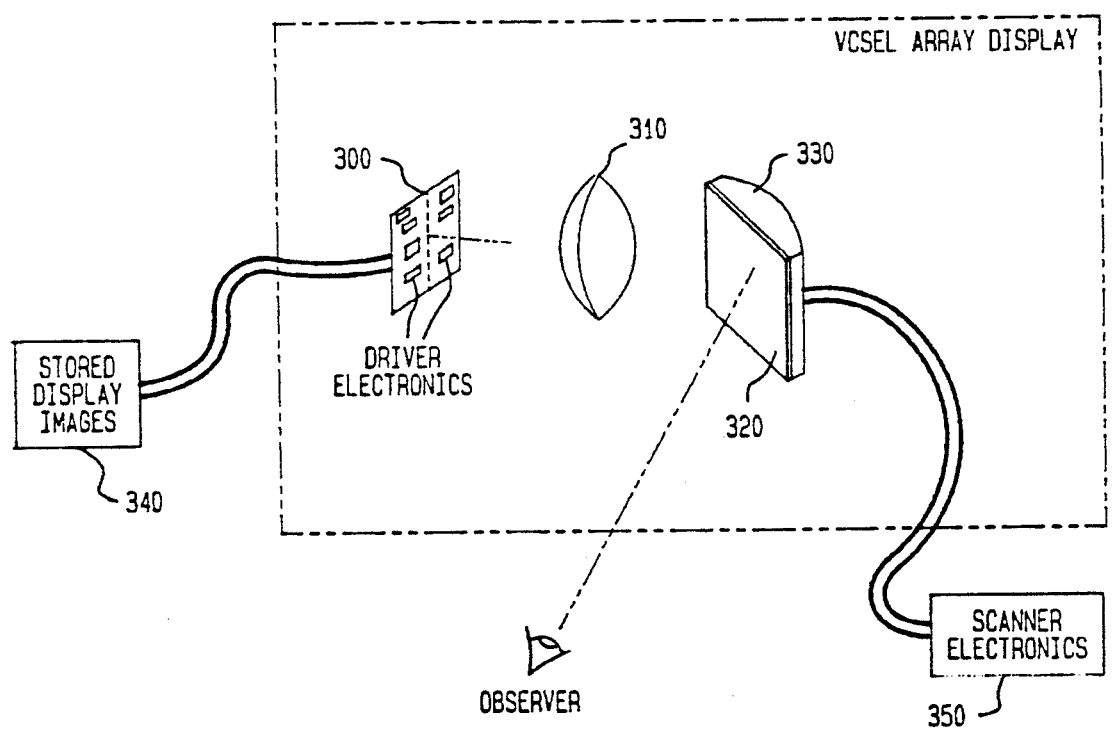
FIG. 3 is another exemplary VCSEL array display system illustrating the use of full-sweep scanning.

Referring to both FIGS. 3 and 4, a VCSEL array 300 comprises a single vertical column of VCSELs represented by the black dots on the left hand side of FIG. 4. Collimated light output from the array is directed by a lens 310 to, for example, a vibrating mirror 320 of an electro-mechanical scanner 330. Electro-mechanical scanner 330 may be of type disclosed in U.S. Pat. No. 4,902,083, which is incorporated herein by reference, in which mirror 320 is vibrated in accordance with control signals from a scanner electronics 350. By selectively illuminating various lasers within VCSEL array 300 at various points during the vibration of mirror 320, successive columns of pixels or picture elements, i.e., display points, will be caused to appear within the field of view of the observer. These display points are represented in FIG. 4 by the entire two-dimensional array of dots, in which the black dots also represent the image position of radiation from the VCSELs in the absence of scanning and the stippled dots represent the additional display points achieved by scanning. At any instance in time, the observer sees only one column or vertical line of VCSEL array 300, but because mirror 320 is repetitively oscillated or scanned in the horizontal direction so as to sweep the apparent location of the vertical line of VCSEL array 300 from one edge of the observer's field of view to the other, the observer's eye perceives a full screen of information, as depicted in FIG. 4.

Typically, mirror 320 is oscillating at approximately 100 Hz so as to create the illusion of a continuous full page or M×M image generated from a 1×M array.

Of course, the vertical line or column of VCSEL array 300 is appropriately modulated or electrically excited to selectively emit light for each column within the desired display image. Such driver electronics may be integrated with the VCSELs. Electronic timing ensures that the proper VCSEL for each column or vertical line is illuminated at the correct time during scanning. One example of a miniature visual display and, more particularly, a HMD which utilizes full-sweep scanning is disclosed in U.S. Pat. No. 4,934,773, which is incorporated herein by reference.

The number of VCSELs in the linear array will be dependent on, for example, the width of the desired image to be displayed to the observer. In one preferred embodiment, for a 1024×1024 display, VCSEL array 300 would contain 1024 linearly-aligned VCSELs. VCSELs contemplated for use in this embodiment are approximately 10 $\mu$m in diameter with approximately a 10 $\mu$m space between each VCSEL.

It is also possible to use sweep scanning with a VCSEL array which is not linear, such as, for example, with a quasi-linear or staggered array. Those skilled in the art will know how to modify the electronic driver signals to compensate, in this case, for the altered positions of the VCSELs.

Other scanning techniques which may be more stable are also contemplated. These techniques, for example, involve the use of micro-optics which is readily integrated with the VCSEL array. The formation of sub-millimeter diameter lenslets as well as the formation of waveguides on the substrate containing the VCSEL array, for example, improve the performance, light efficiency, surface scattering, wavelength sensitivity and beam divergence of the display, all of which decreases the size, weight, and complexity of the imaging systems. FIG. 5 depicts an exemplary monolithic integration of a VCSEL array 510 and micro-lenslets 520 which may be used in the practice of the present invention to facilitate the use of various other scanning techniques, such as electro-optic scanning techniques that employ acousto-optic modulators (AOMs). Those skilled in the art will particularly note that micro-lenslets 520 direct the propagation of the radiation emitted by the VCSELs, performing some, if not all, of the imaging functionality of optical lens 310. For instance, micro-lenslets 520 can decrease the beam divergence of the emitted radiation so that lower numerical aperture optical systems can be used for displaying a desired image within the field of view of the observer. Alternatively, they can increase the beam divergence to increase image resolution.

In another embodiment, a novel sub-scanning technique is employed to create a full M×M display image from a N×N array of VCSELs, where M is a multiple integer of N. Sub-scanning, in contrast to sweep scanning, is the real or virtual movement of the VCSEL array within the field of view of the observer by a distance smaller than the inter-element or VCSEL spacing. Referring to FIG. 6, the solid black dots indicate the position of the image elements of the VCSELs when directly imaged to the observer. When each image element displayed to the observer is scanned along horizontal and vertical axes 610 and 620, respectively, the image elements are perceived to be located at those locations represented by the stippled dots to create the illusion that a full page is being displayed. As with sweep scanning, the radiation from the VCSELs is appropriately modulated during the scanning of the VCSEL array. The scanning can also be accomplished by a real image displacement using, for example, piezo-electric transducers.

Typically, the inter-spacing distance, 1, between each VCSEL is an integer multiple of the spacing, d, between the generated sub-elements or the factor by which the resolution has been improved. It is contemplated that sub-scanning may be achieved by the use of other means, such as piezoelectric transducers, mechanical scanners, acousto-optic modulators and the like.

These scanning techniques may also benefit from the use of micro-optics as well as benefit from their integration with the VCSEL array. For example, typically the ratio of the inter-element spacing to its beam diameter is approximately 2:1. The utilization of micro-lenslets, such as illustrated in FIG. 5, to focus the radiation output or beamlet from each VCSEL to a reduced spot size increases the inter-element spacing to beam diameter ratio. Advantageously, sub-scanning could then be used to increase the effective resolution by generating sub-pixels between adjacent VCSELs as discussed above. In contrast, the beam from a light emitting diode cannot be focused effectively to a reduced spot size.

Rather than utilizing micro-lenslets, larger lenslets which collect light from multiple VCSELs can be used in conjunction with the above sub-scanning techniques. As shown in FIG. 7, lenslet pairs 710 and 720 focus emitted radiation from multiple VCSELs 730a–d to a reduced spot size. Whereas the spacing between VCSEL pairs 730a–b and 730c–d is originally a distance, a, the spacing after the beamlets traverse through the lenslets pairs is a much smaller distance, b. Sub-scanning may now be used to generate sub-pixels between the imaged VCSELs, which sub-pixels are indicated by the stippled dots. Note that the demagnification factor realized by lenslet pairs 730a–b and 730c–d should be an integer number equal to the number of sub-pixels required to fill the field of view of the observer or the space between the imaged VCSEL points. Utilization of a single macro-lens, in contrast, does not increase the effective resolution. Although the macro-lens would decrease the spot size, it would also decrease the inter-element spacing by the same factor. That is, the ratio of the inter-element spacing to spot diameter remains unchanged. Utilization of sub-scanning cannot therefore be used to increase the resolution to its maximum possible extent where a single micro-lens is employed.

It is to be understood for the above sub-scanning technique that the scanning lengths along each axis do not have to be symmetric. By utilizing different scanning lengths it is possible to generate in general a M×N array display image from a K×L VCSEL array, where M and N are multiple integers of K and L, respectively.

As an example of a sub-scanning system, a 128×128 VCSEL array with a 40 $\mu$m inter-element spacing may be scanned in increments of 5 $\mu$m up to the maximum distance of 35 $\mu$m in both axes to achieve a 1024×1024 image (7 sub-positions in each axis between adjacent VCSEL elements).

In the above embodiments, it is contemplated that the information to be displayed may initially be stored in a data storage device such as RAM, ROM, EPROM and the like, which are well known in the art, when a limited set of information needs to be selectively provided to the observer. Otherwise, and for most applications requiring information which varies with time, new information to be displayed may be applied to the VCSELs during the end of a frame, such as at the end of a scan.

Figure 8:
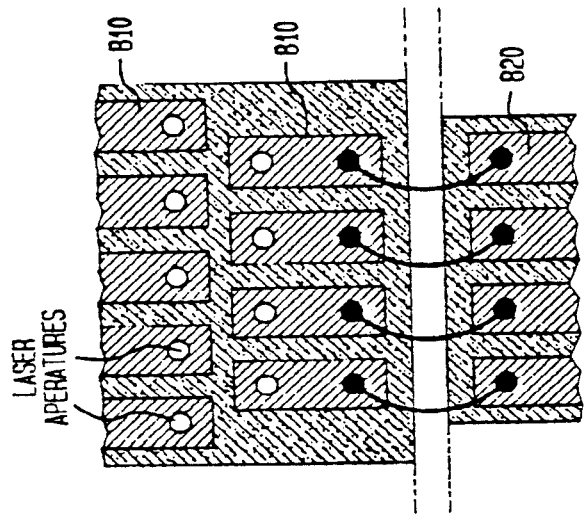
FIG. 8 is a top view of a staggered linear array of VCSELs with electronic drivers fabricated on a different substrate.

New information to be displayed may also be directly applied to each VCSEL to create a full display as discussed above by individually addressing each VCSEL without the use of matrix addressing. Furthermore, the N×N VCSEL array may alternatively comprise rows of VCSELs which are staggered in order to compensate for gaps between the devices. FIG. 8 depicts a portion of a staggered linear array of VCSELs 810 having wirebonds to electronic drivers 820 which may be fabricated on a different substrate. The VCSEL array and electronic drivers may alternatively be fabricated on the same substrate to eliminate the need for wire bonding as disclosed in our pending application Ser. No. 07/823,496. Driver electronics 820 include transistors, such as FETs, bipolar transistors, and the like. In general, the structures disclosed in the above-identified application may be used in the practice of the present invention.

In one example, one-dimensional sub-scanning may be utilized for laser printing applications, such as a 3600 dots-per-inch (dpi) printer covering a 20×75 inch area. A 20 inch linear VCSEL array having 300 VCSELs per inch can be sub-scanned in one dimension such that each VCSEL controls the illumination at 12 points (pixels) in a line to achieve the desired 3600 dpi resolution. Advancing the printing material in the other dimension allows printing in that dimension.

Figure 9:
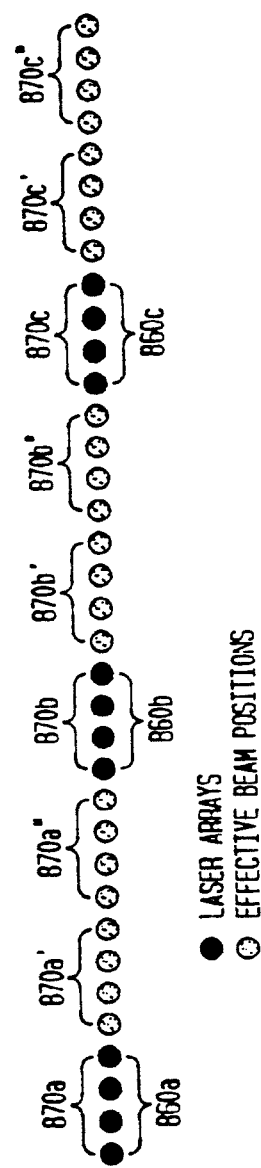
FIG. 9 is illustration of the effective beam positions seen by an observer viewing into a one-dimensional VCSEL array system utilizing jump scanning.

An alternative to one-dimensional sub-scanning is to translate a one-dimensional array of VLDAs, such as of the VCSEL type, by a distance equal to a multiple integer length of the array size plus one inter-pixel distance. As shown in FIG. 9, a VCSEL array 850 comprising three groups 860a–c of a 1×4 VCSEL sub-arrays is scanned by stepping the arrays through the image in multiple illumination phases. In the first phase, the arrays control the illumination of display points 870a–c. For the second phase, radiation from arrays 860a–c is translated, such as by electro-mechanical means, to the positions indicated by stippled dots 870a'–c', respectively. The VCSELs are accordingly modulated with appropriate monochrome or chroma information corresponding to their translated positions to generate new effective resolution elements or pixels. Then, in the third phase, radiation from arrays 860a–c is stepped or translated to positions 870a''–c'', respectively. This stepping or "jump" technique effectively produces 4 additionally pixels for each translation or step. Here, 8 additional pixels are produced for each of sub-arrays 860a–c. This particular type of scanning, referred to as "jump" scanning, may also be used for laser printing applications. For example, if 6000 lasers on 60 chips of 100 lasers each would be required to achieve a desired resolution, then the same task could be done using 10 chips of 100 lasers each by performing 6 "jumps" or repeated translations.

Two-dimensional display images may also be generated by combining both sweep scanning and sub-scanning techniques. Referring to FIG. 10 a 16×16 display image may be generated from 1×4 VCSEL array by sweep scanning along a horizontal axis 910 and sub-scanning along a vertical axis 920. The inter-element spacing, y, between VCSELs is such that 3 sub-positions are generated therebetween by displacing the virtual image of the VCSELs in repeated increments. Along horizontal axis 910 the virtual image perceived by the observer is displaced in increments corresponding to the desired sub-position spacing, x, up to a distance corresponding to 16 pixels. Along vertical axis 920, however, the virtual image is displaced in increments of the desired sub-position spacing, x, but only up to a distance corresponding to the inter-element VCSEL spacing, y.

A unique aspect of the present invention is the ability to generate a full color display. In one embodiment of a full-color display, three different types of VCSELs are needed in a single array, each of which types emits light at a different wavelength such as a green, blue and red, in order to provide color visual images. Illustratively, each row of VCSELs in the array comprises VCSELs of only one type and the colors emitted by such rows alternate in regular fashion. The rows themselves may be staggered to eliminate the gaps between each VCSEL.

Under the control of timing and control circuitry, the appropriate chroma data is applied to each row of VCSELs, but at slightly different time intervals. As a result, the output from each set of three adjacent rows of different color VCSELs is imaged to the same line within the virtual image so as to produce a color display in accordance with well known colorimetry theory.

Approximate ranges for the green, red and blue wavelengths are 610–630 nm, 514–554 nm, and 440–470 nm, respectively. These wavelength ranges satisfactorily provide the full color spectrum and are within the operating range of the VCSELs disclosed in our co-pending application Ser. No. 07/790,964. More specifically, alternating layers of GaInP and $Al_xGa_{1-x}InP$ within the active region may be used to generate radiation in the red region; alternating layers of GaInP and $Al_xGa_{1-x}P$ within the active region may be used to generate radiation in the green region; and alternating layers of $Al_yGa_{1-y}N$ and $Al_xGa_{1-x}N$ within the active region may be used to generate radiation in the blue region.

Preferably, 605 nm, 554 nm and 460 nm will be used as the wavelengths for the red, green, and blue radiation, respectively, because these wavelengths provide the highest efficiency for producing white light. Utilizing longer wavelengths above 605 nm as the red source requires greater red light intensity in order to maintain the same irradiance.

Partially transmissive reflectors may further be used to direct the color display image within the field of view of the observer. These reflectors may be fabricated with enhanced reflectivities at the radiation wavelengths of the VCSELs to minimize the required optical power. Moreover, the reflectivities elsewhere may be minimized (i.e., high transmissivity) to maximize outside viewing of external information.

In accordance with the principles of the invention, VCSELs may be also integrated with, or even replaced by, other display devices, such as visible diode lasers or superluminescent light emitting diodes (SLEDs) to further augment and/or complement the applicability of the present inventive VCSEL array display system. Those skilled in the art will know that a SLED is a light emitting diode (LED) whose efficiency and emission directionality are enhanced by the addition of a partial cavity. SLEDs can be constructed very similarly to VCSELs using standard planar LSI processing techniques. In accordance with the principles of inventions, it is contemplated that VCSELs will be integrated with SLED and/or LEDs.

In another embodiment, sweep scanning in conjunction with sub-scanning may further be utilized to realize a HMD having a ultra-wide field-of-view. More specifically, the sweep scanning is implemented by using a rotating polygonal mirror to achieve fields of view near 180 degrees. Rotating polygonal mirrors are advantageously more robust than vibrating mirrors and, moreover, afford one the capability to exploit the nearly circular symmetry field-of-view of HMDs.

Figure 12:
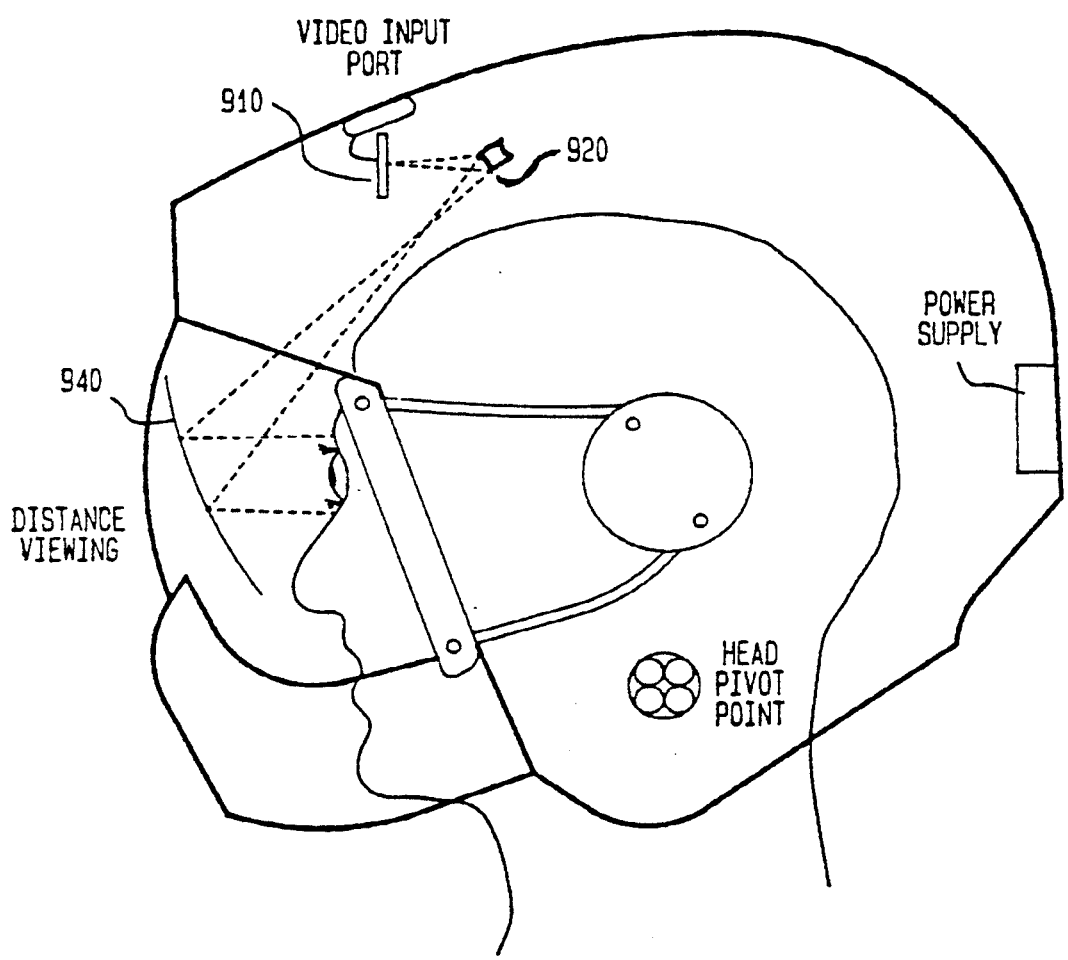
FIG. 12 is a side view of the helmet mounted display of FIG. 11.

Shown in FIGS. 11 and 12 are top and side views, respectively, of a ultra-wide field-of-view HMD which utilizes the principles of the present invention. Polygonal mirror 920 rotates about a vertical axis to sweep the apparent location of a VCSEL array 910 from one edge of the observer's field of view to the other, as previously illustrated in FIG. 4. A 180 degree field-of-view may be achieved by a 90-120 degree rotation of polygonal mirror 920 with the appropriate number of sides. For this arrangement the VCSEL array advantageously is a linear array oriented in a vertical direction so that it is parallel to the axis of rotation of mirror 920. A cylindrical lens 930 located near the upper portion of the HMD or forehead of the observer expands the emitted radiation from VCSEL array 910 along the horizontal axis. The beam expansion is sufficient to fill the pupil aperture of both eyes of the observer to achieve full binocular display. Either an appropriate horizontal curvature on polygonal mirror 920, as shown in FIG. 12, or a multiplicity of cylindrical lenses may, however, be used to replace single cylindrical lens 930.

It is believed that a vertical expansion of only 15-20 mm need be achieved to account for the observer's head motion. Preferably, for binocular displays, horizontal beam widths of 100 mm or more are contemplated. A concave partial reflector 940, which is preferably 50-75 mm from the observer's pupils, produces a virtual image of VCSEL array 910 within the field of view of the observer in accordance with well known optical theory. Appropriately addressing and modulating each individual VCSEL in conjunction with sweep scanning then presents a full panorama display to the observer.

Note that since radiation from each VCSEL traverses through only a small portion of the system, the system components do not introduce any substantial optical aberrations. Thus, resolution better than one cycle per mrad may be accomplished over the entire field-of-view with only a small number of optical components.

Those skilled in the art will readily note that the vertical concavity of both polygonal mirror 920 and partial reflector 940 is used to tailor the vertical beam characteristics of the emitted radiation. Cylindrical lens 930 and the horizontal curvature of concave partial reflector 940, on the other hand, tailor the horizontal shape or beam characteristics of the emitted radiation. In this manner, the emitted radiation can be properly directed into, for example, 180 degree field-of-view.

Multiple VCSEL arrays, each array emitting radiation at a different wavelength can further be employed to produce color images. For example, VCSEL arrays 910, 950 and 960 may be placed at different positions around rotating mirror 920, where array 910 emits red radiation, array 950 emits green radiation and array 960 emits blue radiation. Radiation from each array, of course, would be synchronized to generate a color image in accordance with well known colorimetry theory.

Each side of rotating mirror 920 further could be tilted vertically with respect to each other so that each side sweeps out a unique set of horizontal pixels. For example, with a 4 sided rotating mirror, each side having a slight vertical tilt, sub-scanning as described hereinabove may be realized in the vertical direction to effectively increase the vertical resolution by a factor of four. Hence, a display resolution of 1024 elements in the vertical direction could be accomplished by utilizing a single array having only 256 VCSELs. Note that this latter scheme effectively combines sub-scanning and sweep scanning techniques to produce extremely high resolution display images over a ultra-wide field-of-view with a minimum number of VCSELs.

It should be understood that various other modifications will be readily apparent to those skilled in the art without departing from the scope and spirit of the invention. For example, head-down displays for cockpit environments may also be constructed utilizing the principles of the invention in which a real image is projected from the VCSEL array onto a screen for viewing by an observer. Moreover, simulators may also be constructed employing a combination of virtual-image and real-image displays.

Accordingly, it is not intended that the scope of the claims appended hereto be limited to the description set forth therein, but rather that the claims be construed as encompassing all the features of patentable novelty that reside in the present invention, including all features that would be treated as equivalents thereof by those skilled in the art to which this invention pertains.

What is claimed is:

1. A visual display system comprising:
    a plurality of visible emitting vertical-cavity surface-emitting lasers, each of said lasers emitting radiation; and
    means for displaying an image of said plurality of visible emitting vertical-cavity surface-emitting lasers within the field of view of an observer.

2. The visual display system of claim 1 having a size suitable for headgear-mounted use.

3. The visual display system of claim 2 wherein said means for displaying includes
    means for creating a virtual image of said plurality of visible emitting vertical-cavity surface-emitting lasers,
    and a rotating mirror for displacing said virtual image over a desired field-of-view.

4. The visual display system of claim 1 further comprising means for selectively modulating the intensity of the radiation from each of said plurality of visible emitting vertical-cavity surface-emitting lasers so that said image substantially represents a predetermined visual display.

5. The visual display system of claim 1 wherein said plurality of visible emitting vertical-cavity surface-emitting lasers emit radiation at a predetermined wavelength so that said image is monochrome.

6. The visual display system of claim 1 wherein said plurality of visible emitting vertical-cavity surface-emitting lasers emit radiation at a plurality of wavelengths so that said image is in color.

7. The visual display system of claim 6 wherein said plurality of visible emitting vertical-cavity surface-emitting lasers are aligned in sets of three lines, said vertical-cavity surface-emitting lasers in each line emitting radiation at a different predetermined wavelength.

8. The visual display system of claim 7 wherein vertical-cavity surface-emitting lasers in a first line of said sets emit in the visible red region of the electromagnetic spectrum, vertical-cavity surface emitting lasers in a second line of said sets emit in the visible green region of the electromagnetic spectrum, and vertical-cavity surface-emitting lasers in a third line of said sets emit in the visible blue region of the electromagnetic spectrum.

9. The visual display system of claim 8 wherein said vertical-cavity surface-emitting lasers in said first, second and third lines are staggered with respect to each other.

10. The visual display system of claim 1 wherein said plurality of visible emitting vertical-cavity surface-emitting lasers are aligned in a substantially one-dimensional array.

11. The visual display system of claim 1 wherein said plurality of visible emitting vertical-cavity surface-emitting lasers are aligned in a substantially two-dimensional array.

12. The visual display system of claim 1 wherein said means for displaying comprises
   imaging means for creating a virtual image of said plurality of visible emitting vertical-cavity surface-emitting lasers, and
   means for reflecting said virtual image into the field of view of the observer.

13. The visual display system of claim 12 wherein said means for reflecting includes a mirror.

14. The visual display system of claim 12 wherein said means for reflecting includes a partially transmissive, partially reflective faceplate such that the observer can simultaneously view the image of said plurality of visible emitting vertical-cavity surface-emitting lasers and external visual information directed to the observer.

15. The visual display system of claim 12 further comprising
   means for adjusting the location of said virtual image from infinity to a distance close to the observer.

16. The visual display system of claim 15 wherein said means for adjusting includes a mechanical servo for displacing said plurality of vertical-cavity surface emitting lasers.

17. The visual display system of claim 1 further comprising micro-lenslets for directing the propagation of the radiation from said plurality of vertical-cavity surface-emitting lasers.

18. A visual display system for displaying an image having $M \times N$ picture elements within the field of view of an observer, said visual display system comprising:
   a plurality of visible emitting vertical-cavity surface-emitting lasers aligned substantially in at least a first $1 \times N$ array, said lasers emitting radiation;
   means for creating an image of said plurality of visible emitting vertical-cavity surface-emitting lasers;
   means for repetitively displacing the position of said image within the field of view of the observer; and
   means for selectively controlling the intensity of the radiation emitted from each of said plurality of vertical-cavity surface-emitting lasers as the position of said image is displaced to create the desired $M \times N$ image.

19. The visual display system of claim 18 wherein said image is a virtual image.

20. The visual display system of claim 18 wherein said plurality of visible emitting vertical-cavity surface-emitting lasers emit radiation at a predetermined wavelength so that said $M \times N$ image is monochrome.

21. The visual display system of claim 18 wherein said plurality of visible emitting vertical-cavity surface emitting lasers emit radiation at a plurality of wavelengths so that said image is in color.

22. The visual display system of claim 21 wherein said plurality of visible emitting vertical-cavity surface-emitting lasers are aligned in three lines of $1 \times N$ arrays, said vertical-cavity surface-emitting lasers in each line emitting radiation at a different predetermined wavelength.

23. The visual display system of claim 22 wherein vertical-cavity surface-emitting lasers in a first line of said $1 \times N$ arrays emit in the visible red region of the electromagnetic spectrum, vertical-cavity surface emitting lasers in a second line of said $1 \times N$ arrays emit in the visible green region of the electromagnetic spectrum, and vertical-cavity surface-emitting lasers in a third line of said $1 \times N$ arrays emit in the visible blue region of the electromagnetic spectrum.

24. The visual display system of claim 18 further comprising micro-lenslets for directing the propagation of the radiation from said plurality of vertical-cavity surface-emitting lasers.

25. The visual display system of claim 18 wherein vertical-cavity surface-emitting lasers within said $1 \times N$ arrays are staggered with respect to one another.

26. A visual display system for displaying an image having $M \times N$ picture elements within the field of view of an observer, said visual display system comprising:
   a plurality of visible emitting lasers aligned substantially in a $K \times L$ array, said lasers emitting radiation;
   means for creating an image of said plurality of visible emitting vertical-cavity surface-emitting lasers;
   means for repetitively displacing the position of said image within the field of view of the observer; and
   means for selectively controlling the intensity of the radiation emitted from each of said plurality of vertical-cavity surface-emitting lasers as the position of said image is displaced to create the desired $M \times N$ image, where M and N are greater than K and L, respectively.

27. The visual display system of claim 26 wherein said visible emitting lapsers are vertical-cavity surface-emitting lasers.

28. The visual display system of claim 26 wherein said visible emitting lasers are light emitting diodes.

29. The visual display system of claim 26 wherein said visible emitting lasers are edge-emitting laser diodes.

30. The visual display system of claim 26 wherein said image is a virtual image.

31. The visual display system of claim 26 wherein said plurality of visible emitting lasers emit radiation at a predetermined wavelength so that said $M \times N$ image is monochrome.

32. The visual display system of claim 26 wherein said plurality of visible emitting lasers emit radiation at a plurality of wavelengths so that said image is in color.

33. The visual display system of claim 26 wherein $1 \times L$ arrays of said $K \times L$ arrays of said plurality of visible emitting lasers are aligned in three lines, said visible emitting lasers in each line emitting radiation at a different predetermined wavelength.

34. The visual display system of claim 33 wherein visible emitting lasers within said $1 \times L$ arrays are staggered with respect to one another.

35. The visual display system of claim 33 wherein said visible emitting lasers in a first line of said $1 \times L$ arrays emit in the visible red region of the electromagnetic spectrum, vertical-cavity surface emitting lasers in a second line of said $1 \times L$ arrays emit in the visible green region of the electromagnetic spectrum, and vertical-cavity surface-emitting lasers in a third line of the said $1 \times L$ arrays emit in the visible blue region of the electromagnetic spectrum.

36. The visual display system of claim 26 further comprising micro-lenslets for directing the propagation of the radiation from said plurality of visible emitting lasers.

37. A visual display system for displaying a desired image within the field of view of an observer, said visual display system comprising:
- a laser array including a plurality of vertical-cavity surface-emitting lasers and light emitting diodes, said vertical-cavity surface-emitting lasers and light emitting diodes emitting radiation in the visible electromagnetic spectrum;
- means for creating an optical image of said laser array;
- means for repetitively displacing the position of said optical image within the field of view of the observer; and
- means for selectively controlling the intensity of the radiation emitted from said laser array as the position of said optical image is displaced to create the desired image.

38. A visual display system for displaying a desired image having M×N picture elements within the field of view of an observer, said visual display system comprising:
- a plurality of surface-emitting lasers aligned substantially in K 1×L arrays, said 1×L arrays being arranged in groups of two or more lasers;
- a plurality of lenslet pairs having an optical axis substantially collinear with the direction of propagation of radiation emitted from said lasers, each lenslet pair for imaging lasers within a group to corresponding groups of reduced image size such that the inter-group spacing for the groups of reduced image size is greater than that for said groups of lasers;
- means for creating an image of said groups of reduced image size;
- means for repetitively displacing the position of said image within the field of view of the observer so as to generate sub-picture elements between the groups of reduced image size; and
- means for selectively controlling the intensity of the radiation emitted from each of said plurality of surface-emitting lasers as the position of said image is displaced to create the desired M×N image, where M and N are greater than K and L, respectively.

39. The visual display system of claim 38 wherein said surface-emitting lasers are vertical-cavity surface-emitting lasers.

40. The visual display system of claim 38 wherein said surface-emitting lasers are light emitting diodes.

41. The visual display system of claim 38 wherein said surface-emitting lasers are edge-emitting laser diodes.

42. A visual display system for displaying a desired image having M×N picture elements within the field of view of an observer, said visual display system comprising:
- a plurality of surface-emitting lasers aligned substantially in a 1×L array, said 1×L array being arranged in groups of two or more lasers;
- a plurality of lenslet pairs having an optical axis substantially collinear with the direction of propagation of radiation emitted from said lasers, each lenslet pair for imaging lasers within a group to corresponding groups of reduced image size such that the inter-group spacing for the groups of reduced image size is greater than that for said groups of lasers;
- means for creating an image of said groups of reduced image size;
- means for repetitively displacing the position of said image within the field of view of the observer so as to generate sub-picture elements between the groups of reduced image size and picture elements along first and second directions, respectively, of said image; and
- means for selectively controlling the intensity of the radiation emitted from each of said plurality of surface-emitting lasers as the position of said image is displaced to create the desired M×N image, where M and N are greater than K and L, respectively.

43. The visual display system of claim 42 wherein said surface-emitting lasers are vertical-cavity surface-emitting lasers.

44. The visual display system of claim 42 wherein said surface-emitting lasers are light emitting diodes.

45. The visual display system of claim 42 wherein said surface-emitting lasers are edge-emitting laser diodes.

46. A scanning configuration comprising: a plurality of surface-emitting lasers substantially aligned in at least a 1×N array along a first direction, said 1×N array having an inter-element spacing, d, and each of said lasers corresponding to a picture element;
- means for creating an image of said plurality of surface-emitting lasers; and
- means for repetitively displacing the image of said plurality of surface-emitting lasers by a distance less than the inter-element spacing, d, along said first direction so as to generate sub-picture elements between the images of adjacent lasers.

47. The scanning configuration of claim 46 wherein said surface emitting lasers are vertical-cavity surface-emitting lasers.

48. The scanning configuration of claim 46 wherein said surface emitting lasers are light emitting diodes.

49. The scanning configuration of claim 46 wherein said surface emitting laser are edge-emitting laser diodes.

50. The scanning configuration of claim 46 wherein surface-emitting lasers within said 1×N array are staggered with respect to one another.

51. The scanning configuration of claim 46 further comprising means for respectively displaying the image of said plurality of surface-emitting lasers along a second direction, said second direction substantially perpendicular to said first direction.

52. The scanning configuration of claim 51 wherein said plurality of surface-emitting lasers emit radiation at a plurality of wavelengths so that said image is in color.

53. The scanning configuration of claim 51 wherein said plurality of surface-emitting lasers are aligned in three lines of 1×N arrays, said surface-emitting lasers in each line emitting radiation at a different predetermined wavelength.

54. The scanning configuration of claim 53 wherein surface-emitting lasers in a first line of said 1×N arrays emit in the visible red region of the electromagnetic spectrum, surface-emitting lasers in a second line of said 1×N arrays emit in the visible green region of the electromagnetic spectrum, and surface emitting lasers in a third line of said 1×N arrays emit in the visible blue region of the electromagnetic spectrum.

55. The scanning configuration of claim 46 further comprising micro-lenslets for directing the propagation for radiation from said plurality of surface-emitting lasers.

56. The scanning configuration of claim 46 wherein said means for creating an image includes an optical lens system.

57. The scanning configuration of claim 46 wherein said means for repetitively displacing said image includes a resonating mirror.

58. The scanning configuration of claim 46 wherein said means for repetitively displacing said image includes a rotating mirror.

59. The scanning configuration of claim 58 wherein said rotating mirror has N sides, each side having a vertical tilt with respect to each other.

* * * * *

UNITED STATES PATENT AND TRADEMARK OFFICE
CERTIFICATE OF CORRECTION

PATENT NO. : 5,325,386
DATED : June 28, 1994
INVENTOR(S) : Jewell et al.

It is certified that error appears in the above-indentified patent and that said Letters Patent is hereby corrected as shown below:

On the title page, item [54] and column 1, line 3, change "ASSAY" to --ARRAY--.

Signed and Sealed this

Seventh Day of February, 1995

Attest:

BRUCE LEHMAN

*Attesting Officer*      *Commissioner of Patents and Trademarks*